(12) United States Patent  
Koste et al.

(10) Patent No.: US 8,050,879 B2
(45) Date of Patent: Nov. 1, 2011

(54) PHASE IDENTIFICATION SYSTEM AND METHOD

(75) Inventors: Glen Peter Koste, Niskayuna, NY (US); John Erik Hershey, Ballston Lake, NY (US); Harold Woodruff Tomlinson, Jr., Ballston Spa, NY (US); Pierino Gianni Bonanni, Loudonville, NY (US); Amol Rajaram Kolwalkar, Bangalore (IN)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/629,128

(22) Filed: Dec. 2, 2009

(65) Prior Publication Data

US 2011/0130991 A1    Jun. 2, 2011

(51) Int. Cl.
*G06F 19/00* (2011.01)
*G06R 19/00* (2006.01)
(52) U.S. Cl. .................. 702/72; 324/66; 700/287
(58) Field of Classification Search .......... 702/60, 702/61, 62, 64, 65, 72–75; 324/66, 76.77, 324/86; 700/286, 287
See application file for complete search history.

(56) References Cited

U.S. PATENT DOCUMENTS

| 5,510,700 A | 4/1996 | Pomatto |
| 5,548,207 A | 8/1996 | Smith |
| 7,372,246 B2 | 5/2008 | Marsden et al. |
| 2009/0055031 A1* | 2/2009 | Slota et al. .................. 700/287 |

FOREIGN PATENT DOCUMENTS

| JP | 61153571 A | 7/1986 |
| JP | 2000055961 A | 2/2000 |
| JP | 2001133497 A | 5/2001 |
| WO | 2009017328 A2 | 2/2009 |
| WO | 2009057164 A1 | 5/2009 |

\* cited by examiner

*Primary Examiner* — John H Le
(74) *Attorney, Agent, or Firm* — Ann M. Agosti

(57) ABSTRACT

A method to identify phase is presented. The method includes obtaining electrical parameters at a node and a substation of an electrical grid, processing the electrical parameters of the node and the substation into processed electrical parameters comprising at least one of a voltage harmonic amplitude, a current harmonic amplitude, a geometric harmonic modulated signal, and a noise pattern. The method further includes comparing the processed electrical parameters from the node and the substation and identifying phase information of the node with respect to the substation.

20 Claims, 6 Drawing Sheets

PHASE IDENTIFICATION SYSTEM AND METHOD

BACKGROUND

The subject matter disclosed herein generally relates to phase identification and in particular to characterization of a power distribution network via phase identification.

Typically, power distribution networks carry voltages in three phases that consist of 50 Hz or 60 Hz sine waves that are each out of phase by approximately 120°. The three-phase power is generated in a power plant or other power source and distributed across a wide area to provide power to multiple loads such as residences and businesses. A three-phase power transmission line generally has three transmission conductors, one for each phase, and sometimes a neutral conductor as a fourth conductor.

Utility companies experience difficulties in identifying the phase of a transmission line in the distribution network. The inability to identify the phase information of a given conductor causes operational problems such as difficulty in shifting the customer loads from one phase to another under emergency conditions, or when planning future load expansion. Further, load balancing among the three phases along the distribution network uses phase identification to operate the network effectively. Reliable phase identification would allow increased effectiveness of distribution network management and reliability.

Typically, identifying an unknown phase includes comparing data from a circuit having an unknown phase to data from a circuit having a known phase. Voltage signals from the circuits are digitized and transmitted over a phone system. A series of data conversions and transmissions required in such embodiments causes inductive and/or capacitive delays, often resulting in significant phase differences.

One method to reduce phase delays includes performing a calibration at each location to compensate for the phase lags introduced at various remote locations. However, this approach relies heavily on telephone companies that operate by route switching and signals on telephone lines that are sometimes rerouted over circuits, which may vary by hundreds of miles. The additional phase shift introduced by the time delay associated with such rerouting may affect the calibration.

Accordingly, there is a need to provide an improved method and apparatus for the identification of line phase of a power line in a three-phase power distribution network.

BRIEF DESCRIPTION

Briefly a method to identify phase is presented. The method includes obtaining electrical parameters at a node and a substation of an electrical grid, processing the electrical parameters of the node and the substation into processed electrical parameters comprising at least one of a voltage harmonic amplitude, a current harmonic amplitude, a geometric harmonic modulated signal, and a noise pattern. The method further includes comparing the processed electrical parameters from the node and the substation and identifying phase information of the node with respect to the substation.

In another embodiment, a system for phase identification is presented. The system includes a distribution network comprising a substation coupled to utility nodes and sensors coupled to the utility nodes and the substation for detecting electrical parameters. The system further includes a phase identification unit for digitizing and transmitting the electrical parameters from the substation and the utility nodes and a data center for identifying phase information of the utility nodes by processing and comparing the electrical parameters.

In yet another embodiment, a phase identification system is presented. The phase identification system includes multiple sensors disposed around an electrical distribution network for sensing electrical parameters at a plurality of nodes. The system further includes a digitizer for digitizing the electrical parameters; and a transmitter for transmitting the electrical parameters to a data center, wherein the data center is configured to identify phase information of the nodes.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
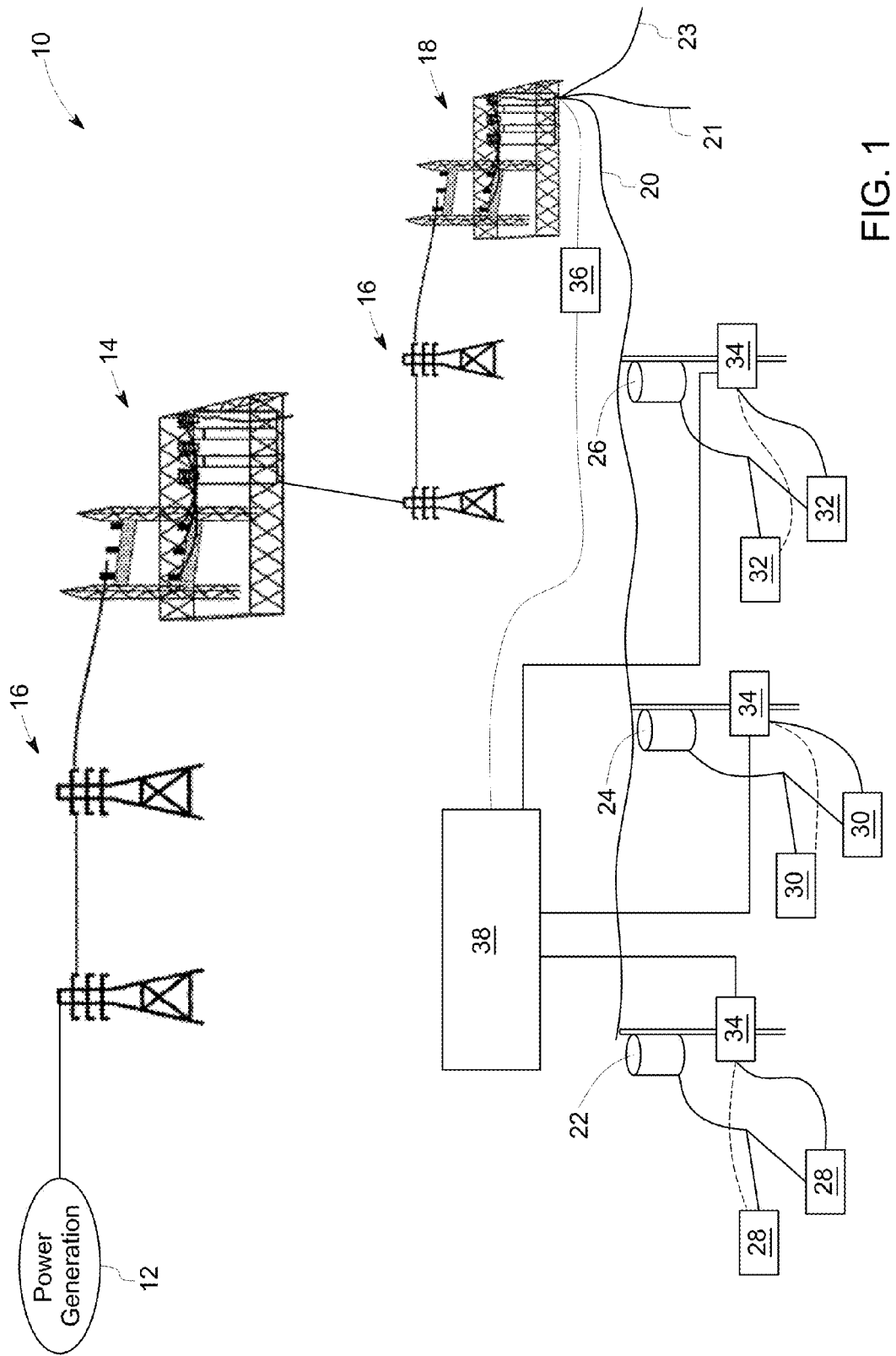
FIG. 1 illustrates an electrical distribution network implementing a phase identification system according to an embodiment of the invention.

FIG. 1 illustrates an electrical distribution network implementing a phase identification system according to an embodiment of the invention. The distribution network 10 includes transmission lines to transfer power generated at a power generation site 12 to one or more end users. Power generation site 12 may include, for example, one or more hydro, thermal, nuclear, or combined gas cycle power plants. Power from the generation site 12 is transmitted at high voltages via high voltage transmission lines 16. High voltage is stepped down to intermediate voltage at transmission substation 14. Further downstream, the intermediate voltages are further stepped down to medium voltage at distribution substation 18. Feeder lines 20 couple the distribution substation to distribution transformers 22,24,26 that supply power to end users such as industrial or residential consumers 28,30,32. For the sake of simplified illustration, a single power generation site, single distribution substation, and single feeder are illustrated. However, multiple such power generation sites may be coupled to multiple transmission substations and distribution substations with multiple feeder lines 20,21,23 to form an electrical distribution network or grid. Phase identification units 34 coupled to the utility nodes 28-32 are configured to provide electrical parameters indicative of phase information at the utility nodes. In an exemplary embodiment, the utility nodes may include a residential meter, a capacitor bank, or a distribution transformer. Further, one or more phase identification units 36 are disposed on substation transformers. In one embodiment a data center 38 is located in a remote location from the utility nodes 28-32 and substation 18 and coupled to the phase identification units 34, 36. In an exemplary embodiment, data center 38 may implement a correlation technique to compare the electrical parameters from the utility nodes and the substation transformers. Further, the phase information may be transmitted back to the phase identification system for local annunciation.

Figure 2:
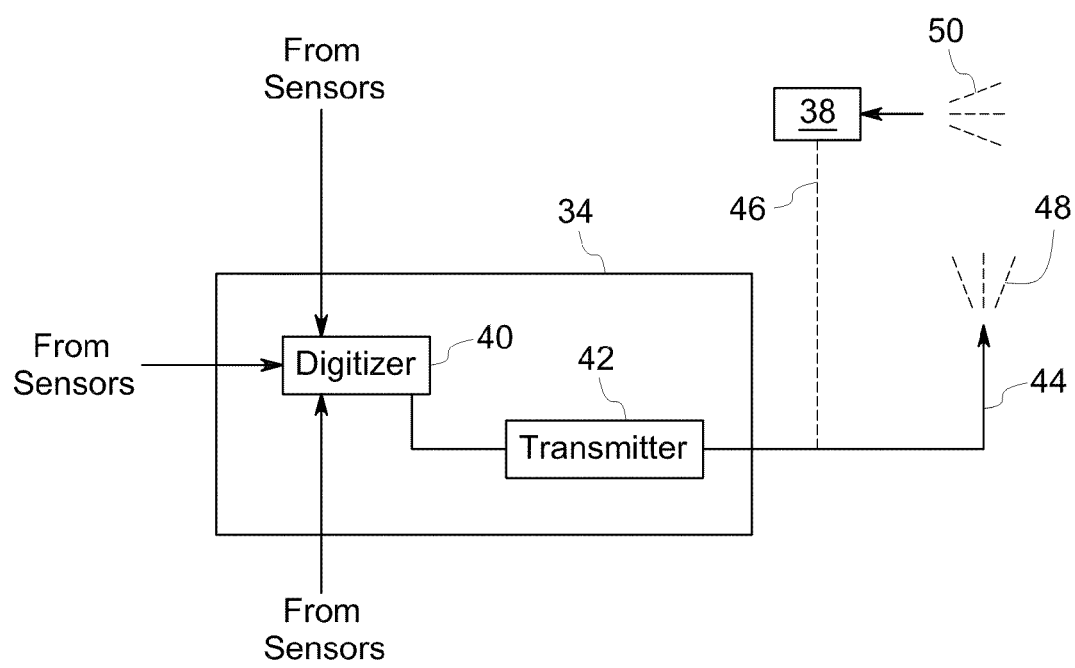
FIG. 2 illustrates an exemplary phase identification system.

FIG. 2 illustrates portions of an exemplary phase identification system. The phase identification unit 34 includes a digitizer 40 coupled to multiple sensors. Sensors may include, for example, current transformers, voltage transducers, noise samplers, and waveform detectors configured to detect electrical parameters around the electrical distribution network. Digitizer 40 includes, in one embodiment, analog to digital circuitry configured to digitize the electrical parameters. A transmitter 42 coupled to the digitizer is configured to transmit digitized electrical parameters to the data center 38. Transmission may be via a wired network 46 such as a power line carrier communication or a wireless network 44 transmitting signals 48. The data center 38 is configured to process the electrical parameters received via wired network 46 or wireless network 50 and compare the parameters to identify phase for the utility nodes. Electrical parameters, for example, from the utility node are compared with electrical parameters from substation to identify phase information.

Figure 3:
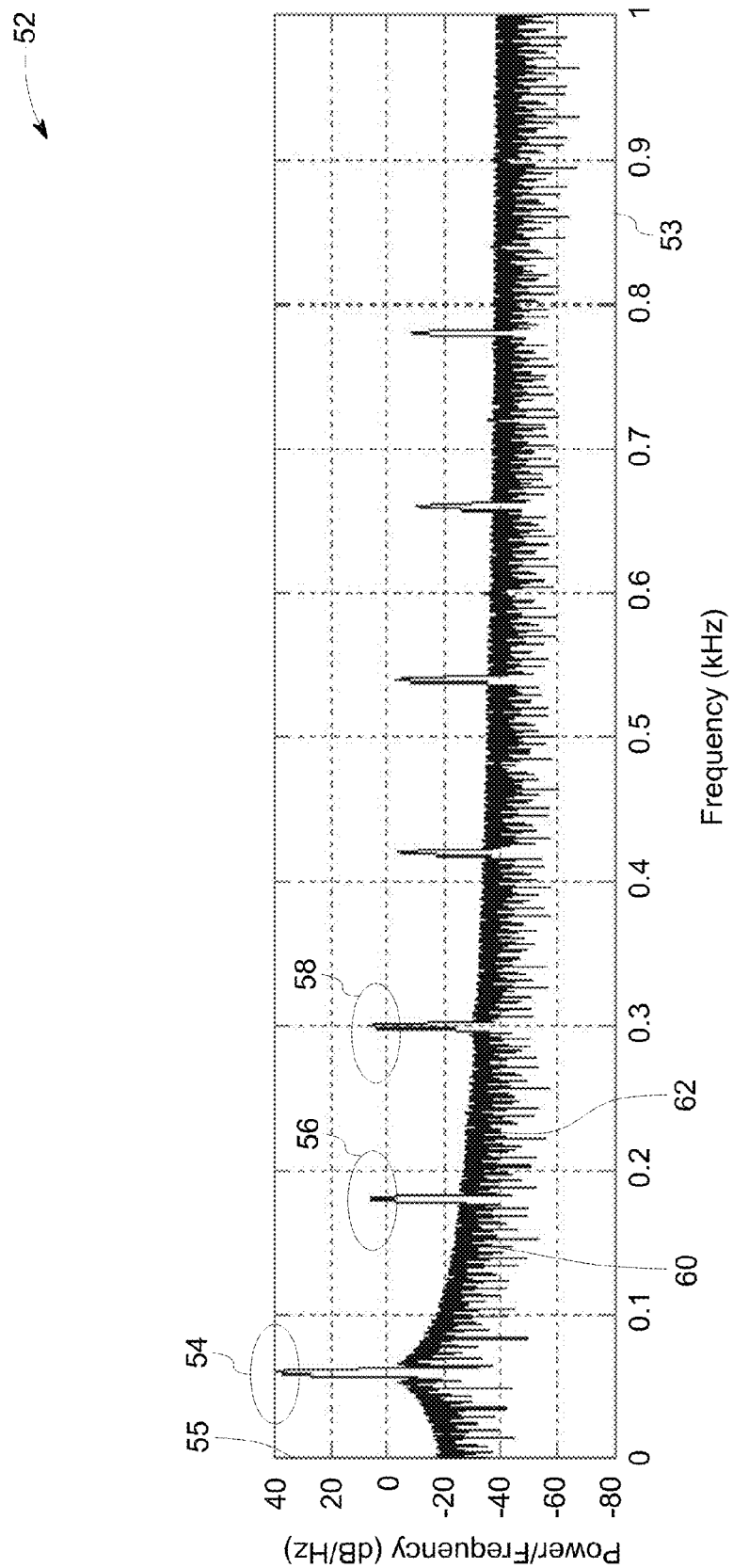
FIG. 3 illustrates a measured profile of an amplitude extracted power spectrum of electrical parameters.

FIG. 3 illustrates a measured profile of an amplitude extracted power spectrum of electrical parameters. The graph 52 illustrates frequency measured in kilohertz on the X-axis 53 and power measured in decibels on the Y-axis 55. The illustrated profile may be obtained from converting the electrical parameters into frequency domain via Fast Fourier Transforms (FFT). The illustrated profile includes multiple peaks 54, 56, 58 that are indicative of peak amplitude of first, third, and fifth harmonics of transformed electrical parameters. The position and peak amplitude of fifth harmonic 58 may define, for example, a signature pattern by way of its relative disposition with respect to first (54) and third (56) harmonics. In another embodiment, a noise pattern 60 (or 62) between the harmonics may be recorded for comparison that includes a signature pattern indicative of a particular phase at the utility node in the distribution network.

Figure 4:
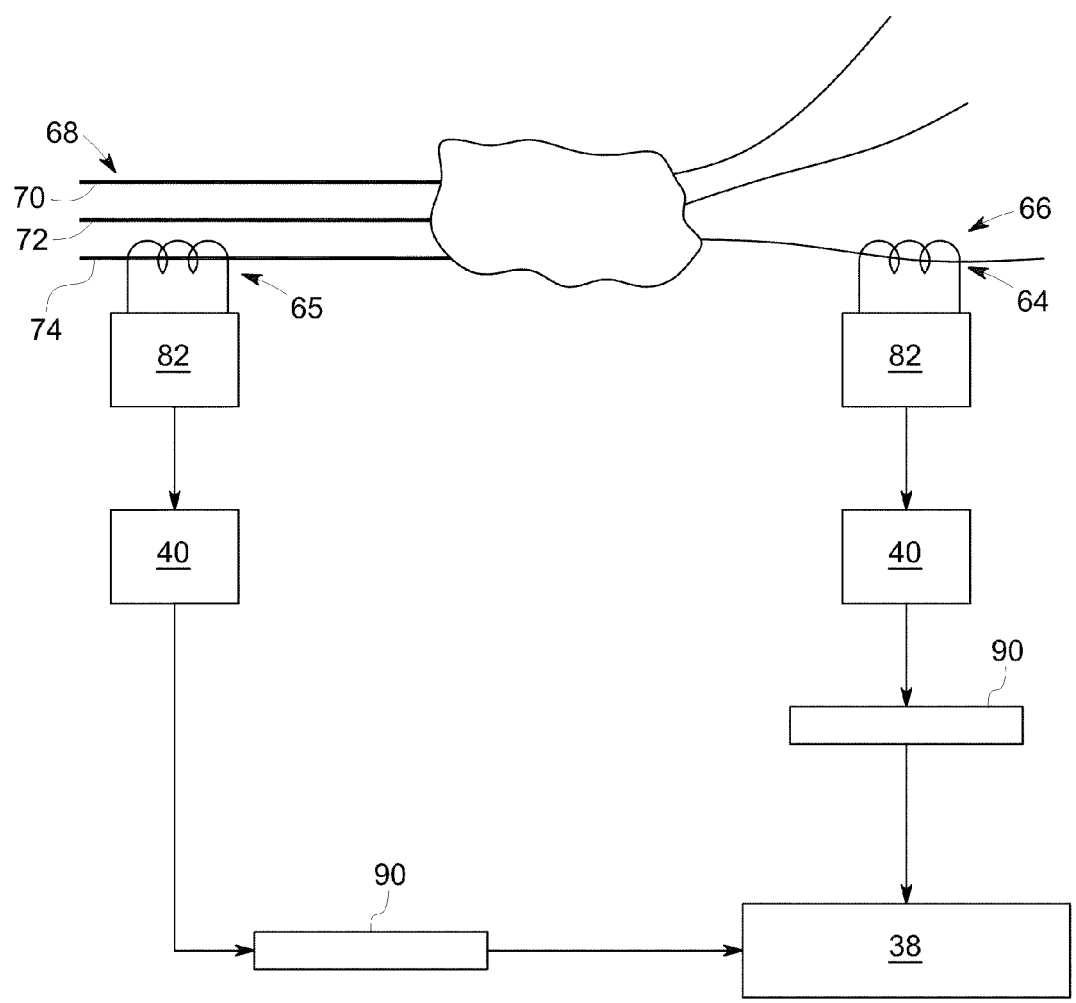
FIG. 4 illustrates a block diagram of a phase identification system implementing noise correlation according to an embodiment of the invention.

FIG. 4 illustrates a block diagram of a phase identification system implementing noise correlation according to an embodiment of the invention. In this embodiment, the sensor 64 is configured to sense an electrical parameter comprising a noise pattern at a utility node 66 (where the phase information has to be determined) and is compared with a noise pattern at a substation 68. In one embodiment, utility node 66 may comprise a utility node 28-32 such as shown in FIG. 1, for example. The correlation technique relies upon finding the maximum cross-correlation of noise samples taken at one site (for example at utility node 66) on one phase with noise samples taken upstream (such as at substation 68) on three phases 70, 72, 74. As cross-correlation is most effective if the sampling occurs at the same time at both sites (66,68), it is useful to have communications and a sampling protocol that ensures synchronization. In one embodiment, to obtain synchronized samples, electrical parameters at the substation are continuously sampled and stored (in the data center) with time stamps and samples from the utility nodes are also stored with time stamps for comparison.

In an exemplary method, to compute phase information at utility node 66 in power line 80, noise samples are simultaneously gathered, for example via sensor 64 coupled to power line 80 and sensor 65 coupled to power line 74. In one embodiment, for example, sensors 64 and 65 comprise induction couplers. A bandpass filter 82 having a central frequency between two sequential harmonics, such as 120 Hz and 180 Hz, for example, may be configured to filter the noise between the two sequential harmonics. The filtered noise is then sampled and an analog-to-digital converter 40 is used to produce digital packets 90 representative of the noise voltage at the sample time. These packets are communicated to data center 38 where a cross-correlation is performed between the noise samples from substation 68 and the noise samples at the utility node 66. In one embodiment, the process of gathering samples from the substation is executed on all three phases of the substation (power lines 70, 72, 74) and on the line with unknown phase at the utility node, and the closest correlation is used to determine the phase of power line 80.

Referring back to FIG. 2, the phase identification unit 34 may include the filter 82 and the analog-to-digital converter 40 (of FIG. 4). Further, correlated phase information from the data center 38 (FIG. 4) may be communicated back to the phase identification unit 34 for displaying the phase information. Communication between the phase identification unit 34 and the data center 38 may include wired transmission or wireless transmission.

Figure 5:
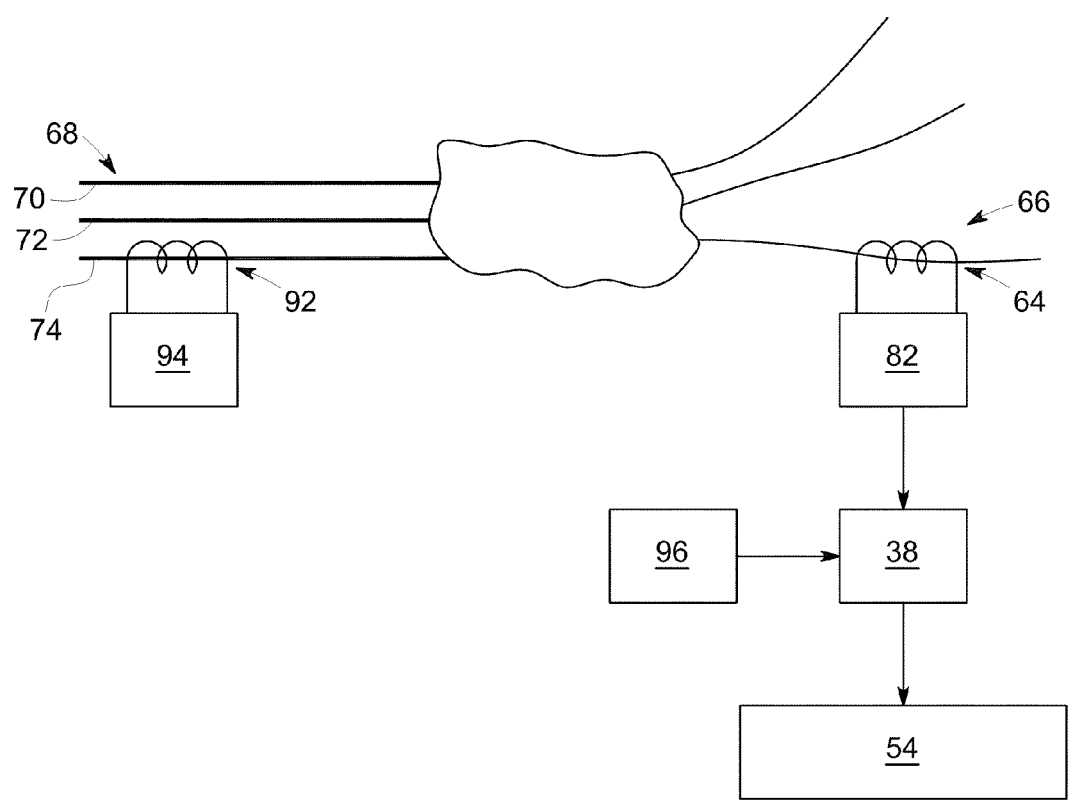
FIG. 5 illustrates a block diagram of a phase identification system implementing geometric harmonic modulated (GHM) signal according to an embodiment of the invention.

FIG. 5 illustrates a block diagram of a phase identification system implementing a geometric harmonic modulated (GHM) signal according to an embodiment of the invention. In this embodiment, one or more GHM signals are injected at one or more points in the distribution network where the phase is known and demodulated where the phase information has to be determined. In one example a signal is injected at substation 68 and demodulated at utility node 66.

GHM signals are generated by GHM signal generators 94, only one of which is shown for purposes of example, and added to the distribution network, by inductive coupling via a couplers 92, for example, to the three power lines 70, 72, 74 at the substation 68. The components of the GHM signals are configured to have frequencies that are as low as possible in order to traverse capacitor banks and other low pass filters that are found in distribution networks. In one example, these frequencies are in the range of hundreds of Hz. At the measurement site such as utility node 66, the GHM signal is extracted, via inductive coupling, for example, using sensors 64. Filters 82, having narrow bandpass segments about the tones of the candidate GHM signals are configured to filter the GHM signals. In one example, the filters may include active filters and perform analog subtraction. The filtered GHM signals are cross-correlated in the data center 38 (with outputs of another GHM signal generator 96 of similar configuration coupled to the data center) against the three possible transmitted signals, and the largest cross-correlation peak is used to identify which of the three candidate GHM signals is on power line 80.

In another exemplary embodiment, the data center 38 of FIG. 1 implements a method to correlate the electrical parameters, wherein the electrical parameters comprise at least one of a voltage waveform, a current waveform, a noise pattern, and a harmonic amplitude. Characteristics of voltage or current waveforms include, for example, peak amplitude, phase difference, and frequency domain attributes such as harmonic peak amplitude. In one embodiment, an alternative to performing a correlation of the entire voltage or current waveform is to use a narrower frequency band of noise between the harmonic frequency content for correlation. There may exist pronounced frequency dependence of the harmonics or the background noise visible in the spectral regions between the harmonics. Similar electrical noise characteristics that exist at lower frequencies may travel to the individual utility nodes connected to the respective phase. The faithfulness with which the noise on one phase at the substation will be present at the utility node will be dependent on the noise or interfering signals on the power line and also on the attenuation and distortion suffered in traversing the portion of the distribution network.

Figure 6:
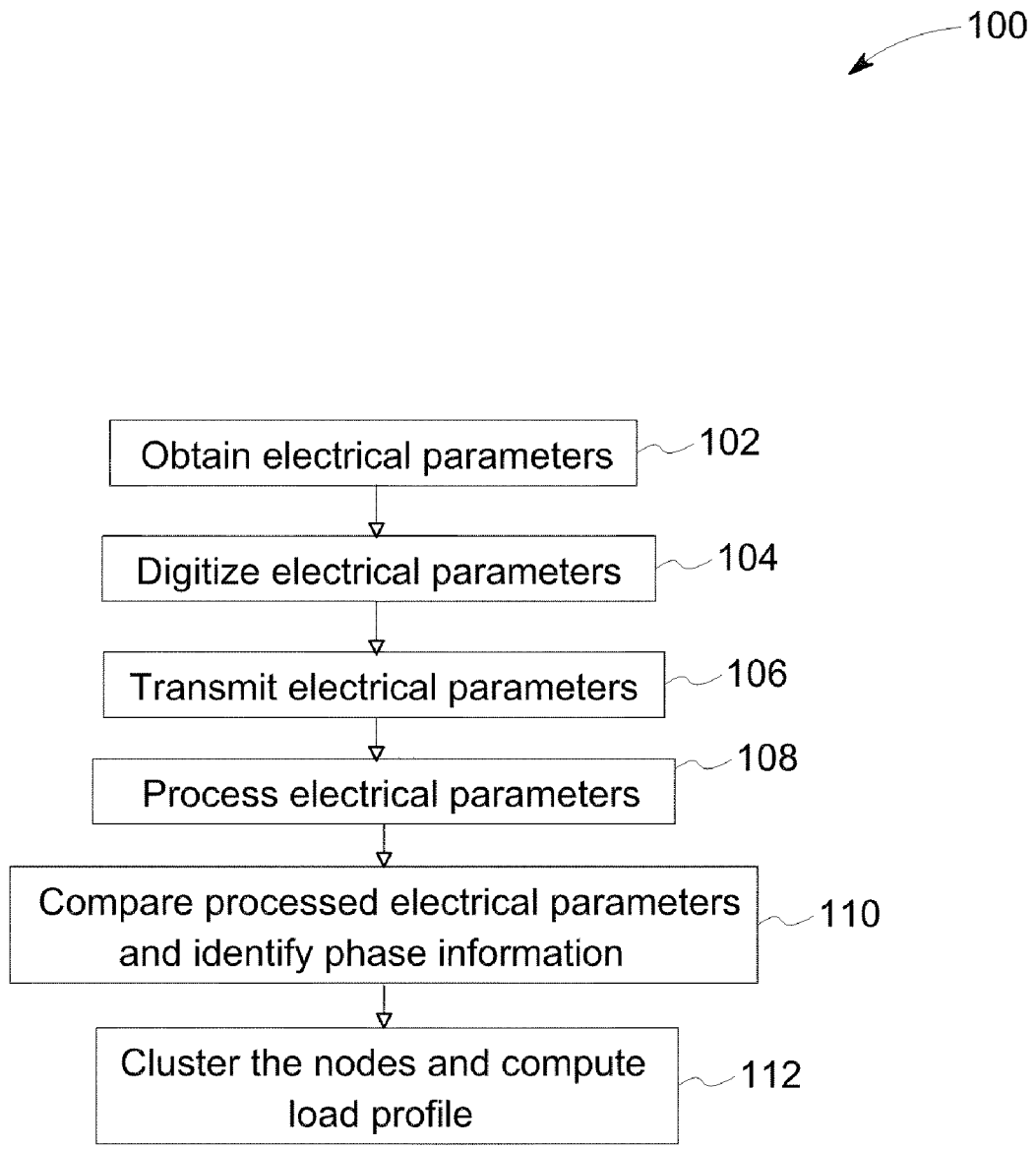
FIG. 6 illustrates an exemplary method of computing phase information at utility nodes.

FIG. 6 illustrates an exemplary method of computing phase information at utility nodes. The method 100 includes obtaining electrical parameters at multiple utility nodes and a substation of an electrical grid (distribution network) in step 102. The method includes digitizing the electrical parameters at step 104. The digitized electrical parameters are transmitted to a data center via wired or wireless transmission at step 106. Further the method 100 includes processing the electrical parameters of the nodes and the substation into processed electrical parameters in the data center at step 108. As used herein, "processing" includes, but is not limited to, providing a time stamp on the electrical parameters. In a specific embodiment, "processing" further includes altering the electrical parameters in a manner conducive for transmission. The electrical parameters may include at least one of voltage harmonic amplitude, a current harmonic amplitude, a geometric harmonic modulated signal, and a noise pattern. The data center is further configured for comparing the processed electrical parameters from the node and the substation. Various techniques, for example, correlation of waveforms or noise pattern may be implemented for identifying phase information of the node with respect to the substation at step 110.

Alternatively, a geometric modulated (GHM) signal may be injected at any point in the distribution network where the phase is known and the GHM signal may be demodulated in step 108 and compared to possible transmitted signals to compute phase information at step 110.

The method 100 further includes clustering the plurality of nodes based on the computed phase information (112). The clustering may include geographical clustering that is useful for balancing a load profile on the substation.

Advantageously, such online monitoring of phase information at utility nodes provides valuable information that is critical for network operations. Phase identification helps distribute load across the grid to improve stability. The phase identification systems as disclosed herein facilitate clustering of nodes that enable optimizing load profile and plan outages effectively during maintenance. Such online systems would eliminate the laborious process of tracking the phase manually from the distribution transformers to the substation. Furthermore, such systems do not suffer from communication delay and synchronization difficulties, and do not require calibration procedures.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method comprising:
    measuring electrical parameters at a node and a substation of an electrical grid by electric sensors;
    processing the electrical parameters of the node and the substation into processed electrical parameters comprising at least one of a voltage harmonic amplitude, a current harmonic amplitude, a geometric harmonic modulated signal, and a noise pattern;
    comparing the processed electrical parameters from the node and the substation; and
    identifying phase information of the node with respect to the substation.

2. The method of claim 1, wherein the electrical parameters comprise voltage waveforms, current waveforms, noise patterns, or combinations thereof.

3. The method of claim 1, wherein processing comprises digitizing the electrical parameters.

4. The method of claim 1 comprising obtaining, processing, and comparing electrical parameters from a plurality of nodes of the electrical grid, computing phase information for the plurality of nodes and clustering the plurality of nodes based on the computed phase information.

5. The method of claim 4, wherein clustering comprises geographical clustering.

6. The method of claim 5 further comprising balancing a load profile on the substation via the clustering.

7. The method of claim 1, wherein comparing the processed electrical parameters comprises comparing third harmonic amplitudes, fifth harmonic amplitudes, seventh harmonic amplitudes, or combinations thereof.

8. The method of claim 1 further comprising transmitting the electrical parameters via a wireless network or a wired network.

9. A system comprising:
    a distribution network comprising a substation coupled to utility nodes;
    sensors coupled to the utility nodes and the substation for detecting electrical parameters;
    a phase identification unit for digitizing and transmitting the electrical parameters from the substation and the utility nodes; and
    a data center for identifying phase information of the utility nodes by processing the electrical parameters into processed electrical parameters from the substation and the utility nodes comprising at least one of a voltage harmonic amplitude, a current harmonic amplitude, a geometric harmonic modulated signal, and a noise pattern and comparing the processed electrical parameters from the utility nodes and the substation.

10. The system of claim 9, wherein the sensors are configured to detect voltage or current waveforms.

11. The system of claim 9, wherein the phase identification unit further comprises a transmitter for transmitting the electrical parameters to the data center.

12. The system of claim 11, wherein the transmitter comprises a wireless transmitter.

13. The system of claim 9, wherein the data center is configured to compare relative harmonic amplitudes.

14. The system of claim 9, wherein the data center is configured to correlate voltage or current waveforms.

15. A phase identification system comprising:
    a plurality of sensors disposed around an electrical distribution network and for sensing electrical parameters at a plurality of nodes and a substation;
    a digitizer for digitizing the electrical parameters; and
    a transmitter for transmitting the electrical parameters to a data center,
    wherein the data center is configured to identify phase information of the nodes by processing the electrical parameters into processed electrical parameters from the substation and the plurality of nodes comprising at least one of a voltage harmonic amplitude, a current harmonic amplitude, a geometric harmonic modulated signal, and a noise pattern and comparing the processed electrical parameters from the plurality of nodes and the substation.

16. The phase identification system of claim 15, wherein the data center is configured for processing and comparing the electrical parameters.

17. The phase identification system of claim 15, wherein the data center is further configured to cluster the nodes based upon the phase information.

18. The phase identification system of claim 17, wherein the data center is further configured to optimize a load profile on the substation based upon node clusters and the phase information.

19. The phase identification system of claim 18, wherein the nodes comprise at least one of a consumer load, a substation transformer, a capacitor bank, and a distribution transformer.

20. The phase identification system of claim 18, wherein the electrical parameters comprise at least one of a voltage waveform, a current waveform, voltage harmonics, current harmonics, and a noise pattern.

* * * * *